US009812623B2

(12) United States Patent
Lee

(10) Patent No.: US 9,812,623 B2
(45) Date of Patent: Nov. 7, 2017

(54) LIGHT EMITTING DEVICE, AND LIGHT EMITTING DEVICE PACKAGE

(71) Applicant: LG INNOTEK CO., LTD., Seoul (KR)

(72) Inventor: Dae Hee Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 13 days.

(21) Appl. No.: 14/249,048

(22) Filed: Apr. 9, 2014

(65) Prior Publication Data

US 2014/0306247 A1   Oct. 16, 2014

(30) Foreign Application Priority Data

Apr. 11, 2013  (KR) .................. 10-2013-0039860

(51) Int. Cl.
| | | |
|---|---|---|
| H01L 33/62 | (2010.01) | |
| H01L 27/15 | (2006.01) | |
| H01L 33/60 | (2010.01) | |
| H01L 33/38 | (2010.01) | |
| H01L 33/40 | (2010.01) | |

(Continued)

(52) U.S. Cl.
CPC ............. *H01L 33/62* (2013.01); *H01L 27/15* (2013.01); *H01L 33/387* (2013.01); *H01L 33/60* (2013.01); *H01L 33/20* (2013.01); *H01L 33/22* (2013.01); *H01L 33/382* (2013.01); *H01L 33/405* (2013.01); *H01L 2224/48091* (2013.01); *H01L 2224/48247* (2013.01)

(58) Field of Classification Search
CPC ....... H01L 33/387; H01L 27/15; H01L 33/60; H01L 33/62
See application file for complete search history.

(56) References Cited

U.S. PATENT DOCUMENTS 9,356,193 B2 *  5/2016  Jeong ............... H01L 27/156
2002/0113246 A1  8/2002  Nagai et al.
(Continued)

FOREIGN PATENT DOCUMENTS

| CN | 102956779 A | 3/2013 |
|---|---|---|
| EP | 2 562 815 A2 | 2/2013 |

OTHER PUBLICATIONS

European Search Report dated Oct. 2, 2014 issued in Application No. 14 164 335.3.
(Continued)

*Primary Examiner* — Laura Menz
*Assistant Examiner* — Candice Y Chan
(74) *Attorney, Agent, or Firm* — KED & Associates, LLP

(57) ABSTRACT

A light emitting device improves light extraction efficiency and may be individually driven in a light emitting device package and/or a light unit. The light emitting device may include first and second light emitting structures. The light emitting structure may include a first conductive first semiconductor layer, a first active layer under the first conductive first semiconductor layer, and a second conductive second semiconductor under the first active layer. The second light emitting structure may include a first conductive third semiconductor layer, a second active layer under the first conductive third semiconductor layer, and a second conductive fourth semiconductor layer under the second active layer.

20 Claims, 8 Drawing Sheets

(51) Int. Cl.
*H01L 33/20* (2010.01)
*H01L 33/22* (2010.01)

(56) References Cited

U.S. PATENT DOCUMENTS

2011/0101390 A1   5/2011   Engl et al.
2011/0241031 A1   10/2011  Von Malm et al. ............ 257/88

OTHER PUBLICATIONS

Chinese Office Action issued in Application No. 201410145316.X dated May 4, 2016.
European Office Action dated Jul. 21, 2017 issued in Application No. 14 164 335.3.

\* cited by examiner

LIGHT EMITTING DEVICE, AND LIGHT EMITTING DEVICE PACKAGE

CROSS-REFERENCE TO RELATED APPLICATION

This application claims priority under 35 U.S.C. §119 to Korean Patent Application No. 10-2013-0039860 filed Apr. 11, 2013, which is hereby incorporated by reference in its entirety.

BACKGROUND

1. Field

The embodiment relates to a light emitting device, a light emitting device package, and a light unit.

2. Background

A light emitting diode (LED) has been extensively used as one of light emitting devices. The LED converts electrical signals into the form of light such as infra-red light, ultra-violet light, and visible light by using the characteristic of a compound semiconductor.

As the light efficiency of the light emitting device is increased, the light emitting device has been used in various fields such as display apparatuses and lighting appliances.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
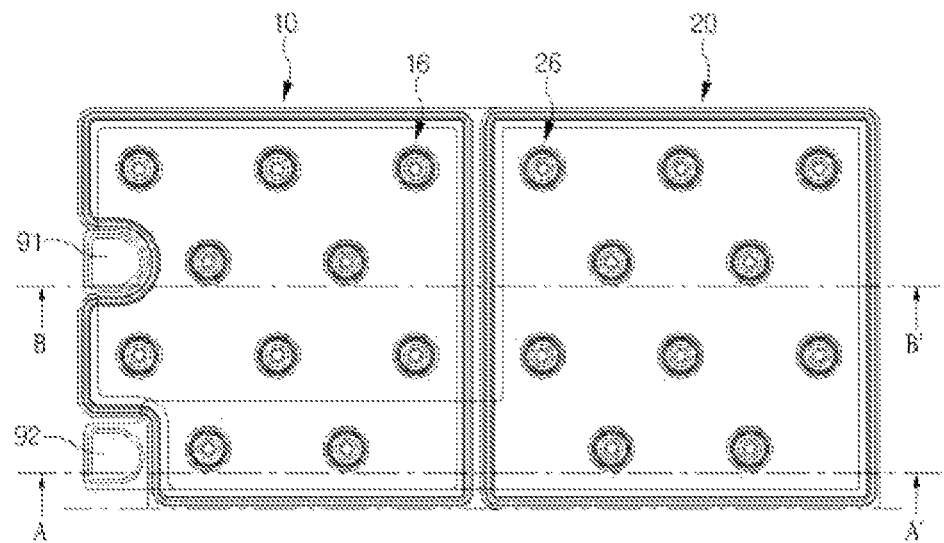
FIG. 1 is a view showing a light emitting device according to the embodiment.
Figure 2:
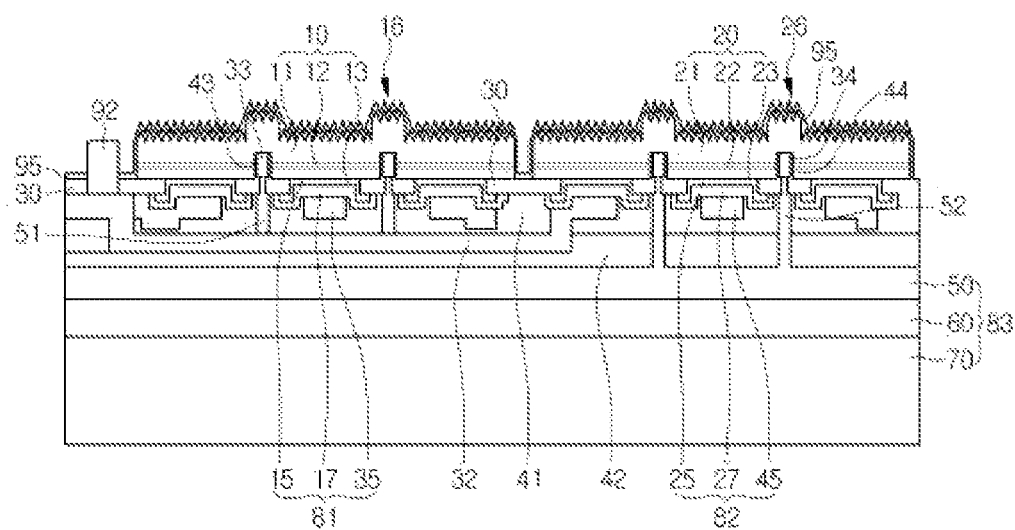
FIG. 2 is a sectional view taken along line A-A' of the light emitting device shown in FIG. 1.
Figure 3:
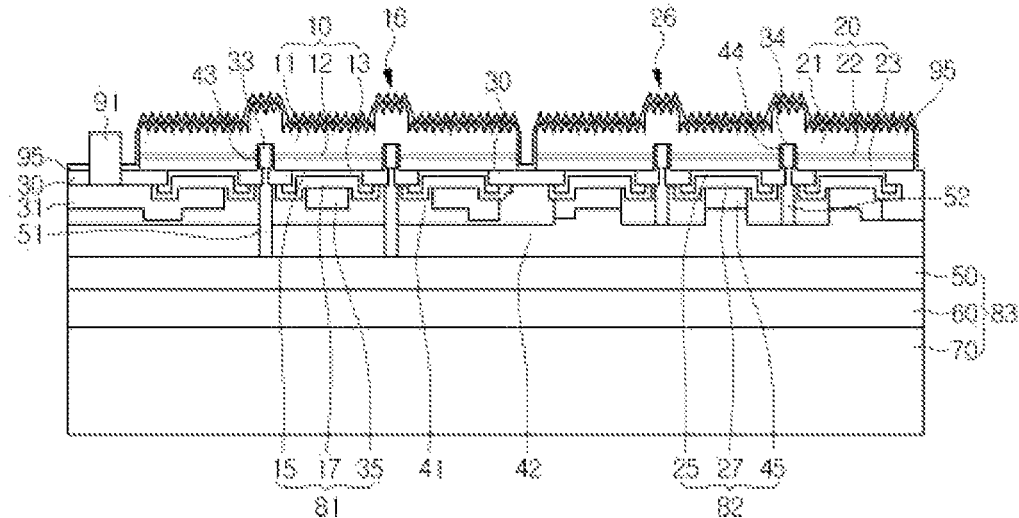
FIG. 3 is a sectional view taken along line B-B' of the light emitting device shown in FIG. 1.

FIG. 1 is a view showing a light emitting device according to the embodiment, FIG. 2 is a sectional view taken along line A-A' of the light emitting device shown in FIG. 1, and FIG. 3 is a sectional view taken along line B-B' of the light emitting device shown in FIG. 1.

As shown in FIGS. 1 to 3, the light emitting device according to the embodiment may include a first light emitting structure 10, a second light emitting structure 20, a first electrode 81, a second electrode 82, a third electrode 83, a first pad 91, and a second pad 92.

The first light emitting structure 10 may include a first conductive first semiconductor layer 11, a first active layer 12, and a second conductive second semiconductor layer 13. The first active layer 12 may be disposed between the first conductive first semiconductor layer 11 and the second conductive second semiconductor layer 13. The first active layer 12 may be disposed under the first conductive first semiconductor layer 11, and the second conductive second semiconductor layer 13 may be disposed under the first active layer 12.

The first conductive first semiconductor layer 11 may include an N-type semiconductor layer doped with N-type dopants serving as first conductive dopants, and the second conductive second semiconductor layer 13 may include a P-type semiconductor layer doped with P-type dopants serving as second conductive dopants. In addition, the first conductive first semiconductor layer 11 may include a P-type semiconductor layer, and the second conductive second semiconductor layer 13 may include an N-type semiconductor layer.

For example, the first conductive first semiconductor layer 11 may include an N-type semiconductor layer. The first conductive first semiconductor layer 11 may be formed by using a compound semiconductor. The first conductive first semiconductor layer 11 may be formed by using a group II-VI compound semiconductor, or a group III-V compound semiconductor.

For example, the first conductive first semiconductor layer 11 may be formed by using a semiconductor material having a compositional formula of $In_xAl_yGa_{1-x-y}N$ ($0 \leq x \leq 1$, $0 \leq y \leq 1$, and $0 \leq x+y \leq 1$). For example, the first conductive first semiconductor layer 11 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The first active layer 12 may emit light due to the energy band gap difference according to materials constituting the first active layer 13 through the combination of electrons (or holes) injected through the first conductive first semiconductor layer 11 and holes (or electrons) injected through the second conductive second semiconductor layer 13. The first active layer 12 may have one of a single quantum well (SQW) structure, a multi-quantum well (MQW) structure, a quantum dot structure, or a quantum wire structure, but the embodiment is not limited thereto.

The first active layer 12 may be formed by using a compound semiconductor. For example, the first active layer 12 may be formed by using a group II-VI compound semiconductor or a group III-V compound semiconductor. For example, the first active layer 12 may be formed by using a semiconductor material having a compositional formula of $In_xAl_yGa_{1-x-y}N$ ($0 \leq x \leq 1$, $0 \leq y \leq 1$, and $0 \leq x+y \leq 1$). When the first active layer 12 has an MQW structure, the first active layer 12 may be formed by stacking a plurality of well layers and a plurality of barrier layers. For example, the first active layer 12 may be formed at a cycle of InGaN well layer/GaN barrier layer.

For example, the second conductive second semiconductor layer 13 may be formed by using a P-type semiconductor layer. The second conductive second semiconductor layer 13 may be formed by using a compound semiconductor. For example, the second conductive second semiconductor layer 13 may be formed by using a group II-VI compound semiconductor, or a group III-V compound semiconductor.

For example, the second conductive second semiconductor layer 13 may be formed by using a semiconductor material having a compositional formula of $In_xAl_yGa_{1-x-y}N$ ($0 \le x \le 1$, $0 \le y \le 1$, and $0 \le x+y \le 1$). For example, the second conductive second semiconductor layer 13 may include one selected from the group consisting of GaN, AlN, AlGaN, InGaN, InN, InAlGaN, AlInN, AlGaAs, GaP, GaAs, GaAsP, or AlGaInP doped with P-type dopants such as Mg, Zn, Ca, Sr, and Ba.

Meanwhile, the first conductive first semiconductor layer 11 may include a P-type semiconductor layer and the second conductive second semiconductor layer 13 may include the N-type semiconductor layer. In addition, a semiconductor layer including an N-type or P-type semiconductor layer may be additionally disposed under the second conductive second semiconductor layer 13. Accordingly, the first light emitting structure 10 may have at least one of an NP junction structure, a PN junction structure, an NPN junction structure, and a PNP junction structure. In addition, impurities may be doped into the first conductive first semiconductor layer 11 and the second conductive second semiconductor layer 13 with uniform or non-uniform doping concentration. In other words, the first light emitting structure 10 may have various structures, and the embodiment is not limited thereto.

In addition, a first conductive InGaN/GaN superlattice structure or InGaN/InGaN superlattice structure may be disposed between the first conductive first semiconductor layer 11 and the first active layer 12. In addition, a second conductive AlGaN layer may be disposed between the second conductive second semiconductor layer 13 and the first active layer 12.

The second light emitting structure 20 may include a first conductive third semiconductor layer 21, a second active layer 22, and a second conductive fourth semiconductor layer 23. The second active layer 22 may be disposed between the first conductive third semiconductor layer 21 and the second conductive fourth semiconductor layer 23. The second active layer 22 may be disposed under the first conductive third semiconductor layer 21, and the second conductive fourth semiconductor layer 23 may be disposed under the second active layer 22.

For example, the first conductive third semiconductor layer 21 may include an N-type semiconductor layer doped with N-type dopants serving as first conductive dopants, and the second conductive fourth semiconductor layer 23 may include a P-type semiconductor layer doped with P-type dopants serving as second conductive dopants. In addition, the first conductive third semiconductor layer 21 may include a P-type semiconductor layer, and the second conductive fourth semiconductor layer 23 may include an N-type semiconductor layer.

The structure and material of the second light emitting structure 20 may be similar to those of the first light emitting structure 10, so the details thereof will be omitted.

The light emitting device according to the embodiment may include a first reflective layer 17. The first reflective layer 17 may be electrically connected to the second conductive second semiconductor layer 13. The first reflective layer 17 may be disposed under the first light emitting structure 10. The first reflective layer 17 may be disposed under the second conductive second semiconductor layer 13. The first reflective layer 17 may reflect light incident thereto from the first light emitting structure 10 to increase the quantity of light extracted to an outside.

The light emitting device according to the embodiment may include a first ohmic contact layer 15 disposed between the first reflective layer 17 and the second conductive second semiconductor layer 13. The first ohmic contact layer 15 may make contact with the second conductive second semiconductor layer 13. The first ohmic contact layer 15 may make ohmic contact with the first light emitting structure 10. The first ohmic contact layer 15 may include a region that makes ohmic-contact with the first light emitting structure 10. The first ohmic contact layer 15 may include a region that makes ohmic-contact with the second conductive second semiconductor layer 13.

For example, the first ohmic contact layer 15 may include a transparent conductive oxide layer. For example, the first ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, or Ti.

The first reflective layer 17 may include a material having high reflectance. For example, the first reflective layer 17 may include metal including at least one of Ag, Ni, Al, Rh, Pd, Ir, Ru, Mg, Zn, Pt, Cu, Au, Hf, or the alloy thereof. In addition, the first reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the first reflective layer 17 may include at least one of Ag, Al, an Ag—Pd—Cu alloy, or an Ag—Cu alloy.

For example, the first reflective layer 17 may have a structure in which an Ag layer and a Ni layer are alternately disposed, and may include Ni/Ag/Ni or a Tl layer, and a Pt layer. In addition, the first ohmic contact layer 15 may be disposed under the first reflective layer 17, and at least a portion of the first ohmic contact layer 15 may make ohmic-contact with the first light emitting structure 10 through the first reflective layer 17.

The light emitting device according to the embodiment may include a second reflective layer 27. The second reflective layer 27 may be electrically connected to the second conductive fourth semiconductor layer 23. The second reflective layer 27 may be disposed under the second light emitting structure 20. The second reflective layer 27 may be disposed under the second conductive fourth semiconductor layer 23. The second reflective layer 27 may reflect light incident thereto from the second light emitting structure 20 to increase the quantity of light extracted to an outside.

The light emitting device according to the embodiment may include a second ohmic contact layer 25 disposed between the second reflective layer 27 and the second conductive fourth semiconductor layer 23. The second ohmic contact layer 25 may make contact with the second conductive fourth semiconductor layer 23. The second ohmic contact layer 25 may make ohmic contact with the second light emitting structure 20. The second ohmic contact layer 25 may include a region that makes ohmic-contact with the second light emitting structure 20. The second ohmic contact layer 25 may include a region that makes ohmic-contact with the second conductive fourth semiconductor layer 23.

For example, the second ohmic contact layer 25 may include a material and a structure similar to those of the first ohmic contact layer 15. In addition, the second reflective layer 27 may include a material and a structure similar to those of the first reflective layer 17.

The light emitting device according to the embodiment may include a first metal layer 35 disposed under the first reflective layer 17. The first metal layer 35 may include at least one of Au, Cu, Ni, Ti, Ti—W, Cr, W, Pt, V, Fe, or Mo.

The light emitting device according to the embodiment may include a second metal layer 45 disposed under the second reflective layer 27. The second metal layer 45 may include at least one of Au, Cu, Ni, Ti, Ti—W, Cr, W, Pt, V, Fe, or Mo.

The first and second metal layers 35 and 45 may be formed by using the same material or mutually different materials.

According to the embodiment, the first electrode 81 may include at least one of the first reflective layer 17, the first ohmic contact layer 15, or the first metal layer 35. For example, the first electrode 81 may include all of the first reflective layer 17, the first metal layer 35, or the first ohmic contact layer 15, or may include one or two selected from the first reflective layer 17, the first metal layer 35, or the first ohmic contact layer 15.

The first electrode 81 according to the embodiment may be disposed under the first light emitting structure 10. The first electrode 81 may be electrically connected to the second conductive second semiconductor layer 13.

According to the embodiment, the second electrode 82 may include at least one of the second reflective layer 27, the second ohmic contact layer 25, or the second metal layer 45. For example, the second electrode 82 may include all of the second reflective layer 27, the second metal layer 45, and the second ohmic contact layer 25, or may include one or two selected from the second reflective layer 27, the second metal layer 45, or the second ohmic contact layer 25.

The second electrode 82 according to the embodiment may be disposed under the second light emitting structure 20. The second electrode 82 may be electrically connected to the second conductive fourth semiconductor layer 23.

The light emitting device according to the embodiment may include a channel layer 30 disposed around a lower portion of the first light emitting structure 10. The channel layer 30 may be disposed around a lower portion of the second light emitting structure 20. A first region of the channel layer 30 may be disposed under the second conductive second semiconductor layer 13.

A first region of the channel layer 30 may make contact with a bottom surface of the second conductive second semiconductor layer 13. A second region of the channel layer 30 may be disposed under the second conductive fourth semiconductor layer 23. The second region of the channel layer 30 may make contact with a bottom surface of the second conductive fourth semiconductor layer 23.

The first region of the channel layer 30 may be disposed between the second conductive second semiconductor layer 13 and the first reflective layer 17. The second region of the channel layer 30 may be disposed between the second conductive fourth semiconductor layer 23 and the second reflective layer 27. The first region of the channel layer 30 may be disposed between the second conductive second semiconductor layer 13 and the first ohmic contact layer 15.

The second region of the channel layer 30 may be disposed between the second conductive fourth semiconductor layer 23 and the second ohmic contact layer 25.

The channel layer 30 may be disposed at a lower peripheral portion of the first light emitting structure 10. The channel layer 30 may extend outward from the sidewall of the first light emitting structure 10. A side of the channel layer 30 may make contact with a side of the first electrode 81. The side of the channel layer 30 may make contact with a side of the first ohmic contact layer 15. Some region of the channel layer 30 may be disposed on a top surface of the first electrode 81. Some region of the channel layer 30 may make contact with a top surface of the first metal layer 35.

The channel layer 30 may be disposed at a lower peripheral portion of the second light emitting structure 20. The channel layer 30 may extend outward from the sidewall of the second light emitting structure 20. A side of the channel layer 30 may make contact with a side of the second electrode 82. The side of the channel layer 30 may make contact with a side of the second ohmic contact layer 25. Some region of the channel layer 30 may be disposed on a top surface of the second electrode 82. Some region of the channel layer 30 may make contact with a top surface of the second metal layer 45.

The channel layer 30 may be referred to as an isolation layer. The channel layer 30 may serve as an etching stopper when an isolation process is performed with respect to the first and second light emitting structures 10 and 20 later. In addition, the channel layer 30 may prevent the electrical characteristic of the light emitting device from being degraded caused by the isolation process.

The channel layer 30 may include an insulating material. For example, the channel layer 30 may be formed by using an oxide or a nitride. For example, the channel layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN.

The light emitting device according to the embodiment may include a first insulating layer 41 to electrically insulate the first electrode 81 from the second electrode 82. The first insulating layer 41 may be disposed between the first and second electrodes 81 and 82. The first insulating layer 41 may be disposed under the first electrode 81. The first insulating layer 41 may be disposed under the second electrode 82. A top surface of the first insulating layer 41 may make contact with the channel layer 30.

The first insulating layer 41 may be formed by using an oxide or a nitride. For example, the first insulating layer 41 may include at least one selected from the group consisting of $SiO_2$, $Si_xO_y$, $Si_3N_4$, $Si_xN_y$, $SiO_xN_y$, $Al_2O_3$, $TiO_2$, or AlN.

The first insulating layer 41 may be formed at the thickness of 100 nm to 2000 nm. If the thickness of the first insulating layer 41 is less than 100 nm, the insulating characteristic of the first insulating layer 41 may be degraded. If the thickness of the first insulating layer 41 exceeds 2000 nm, the first insulating layer 41 may be broken in the subsequent process.

The light emitting device according to the embodiment may include a third electrode 83 disposed under the first light emitting structure 10, and electrically connects the first conductive first semiconductor layer 11 to the first conductive third semiconductor layer 21. The third electrode 83 may be disposed under the second light emitting structure 20. The third electrode 83 may be disposed under the first insulating layer 41.

The third electrode 83 may include at least one of a third metal layer 50, a bonding layer 60, and a conductive support member 70. The third electrode 83 may include all of the third metal layer 50, the bonding layer 60, and the conductive support member 70. In addition, the third electrode 83 may include one or two selected from the third metal layer 50, the bonding layer 60, and the conductive support member 70.

The third metal layer 50 may include at least one selected from the group consisting of Cu, Ni, Ti, Ti—W, Cr, W, Pt, V, Fe, or Mo. The third metal layer 50 may serve as a diffusion barrier layer. A bonding layer 60 and a conductive support member 70 may be disposed under the third metal layer 50.

The third metal layer 50 may prevent a material included in the bonding layer 60 from being diffused to the reflective layer 17 and the second reflective layer 27 in the process of providing the bonding layer 60. The third metal layer 50 may prevent a material, such as Sn, included in the bonding layer 60 from exerting an influence on the reflective layer 17 and the second reflective layer 27.

The bonding layer 60 includes barrier metal or bonding metal. For example, the bonding layer 60 may include at least one of Ti, Au, Sn, Ni, Cr, Ga, In, Bi, Cu, Ag, Nb, Pd or Ta. The conductive support member 70 may support the first and second light emitting structures 10 and 20 according to the embodiment while performing a heat radiation function. The bonding layer 60 may be formed in the form of a seed layer.

For example, the conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

The light emitting device according to the embodiment may further include a second insulating layer 42 disposed between the third electrode 83 and the first insulating layer 41. The second insulating layer 42 may be disposed between the first electrode 81 and the third electrode 83. The second insulating layer 42 may be disposed between the second electrode 82 and the third electrode 83.

For example, the second insulating layer 42 may be formed by using an oxide or a nitride. For example, the second insulating layer 42 may include at least one selected from the group consisting of SiO2, SixOy, Si3N4, SixNy, SiOxNy, Al2O3, TiO2, or AlN.

The second insulating layer 42 may be formed at the thickness of 100 nm to 2000 nm. If the thickness of the second insulating layer 42 is less than 100 nm, the insulating characteristic of the second insulating layer 42 may be degraded. If the thickness of the second insulating layer 42 exceeds 2000 nm, the second insulating layer 42 may be broken in the subsequent process.

The light emitting device according to the embodiment may include a first contact part 33 disposed at a lower region of the first conductive first semiconductor layer 11. The first contact part 33 may be electrically connected to the third electrode 83. The first contact part 33 may be disposed through the first active layer 12. The first contact part 33 may be inserted into a recess disposed in the first conductive first semiconductor layer 11. The first contact part 33 comprises a plurality of contact parts. A top surface of the first contact part 33 may make contact with the first conductive first semiconductor layer 11.

The first contact part 33 may be electrically connected to the third electrode 83 through a third connection wire 51. The third connection wire 51 may be disposed through the second insulating layer 42. The third connection wire 51 may be disposed through the first insulating layer 41. The third connection wire 51 may be electrically insulated from the first electrode 81.

The first contact part 33 may include at least one selected from the group consisting of Cr, V, W, Ti, Zn, Ni, Cu, Al, Au, or Mo. For example, the third connection wire 51 may include at least one selected from the group consisting of Ti, Au, Sn, Ni, Cr, Ga, In, Bi, Cu, Ag, Nb, Pd or Ta.

The light emitting device according to the embodiment may be disposed in the first light emitting structure 10, and may include a third insulating layer 43 disposed at a peripheral portion of the first contact part 33. The third insulating layer 43 may electrically insulate the first contact part 33 from the first active layer 12. The third insulating layer 43 may electrically insulate the first contact part 33 from the second conductive second semiconductor layer 13.

For example, the third insulating layer 43 may be formed by using an oxide or a nitride. For example, the third insulating layer 43 may include at least one selected from the group consisting of SiO2, SixOy, Si3N4, SixNy, SiOxNy, Al2O3, TiO2, or AlN.

The light emitting device according to the embodiment may include a second contact part 34 disposed at a lower region of the first conductive third semiconductor layer 21. The second contact part 34 may be electrically connected to the third electrode 83. The second contact part 34 may be disposed through the second active layer 22. The second contact part 34 may be inserted into a recess disposed in the first conductive third semiconductor layer 21. A plurality of second contact parts 34 may be formed. A top surface of the second contact part 34 may make contact with the first conductive third semiconductor layer 21.

The second contact part 34 may be electrically connected to the third electrode 83 through a fourth connection wire 52. The fourth connection wire 52 may be disposed through the second insulating layer 42. The fourth connection wire 52 may be disposed through the first insulating layer 41. The fourth connection wire 52 may be electrically insulated from the second electrode 82.

The second contact part 34 may include at least one selected from the group consisting of Cr, V, W, Ti, Zn, Ni, Cu, Al, Au, or Mo. For example, the fourth connection wire 52 may include at least one selected from the group consisting of Ti, Au, Sn, Ni, Cr, Ga, In, Bi, Cu, Ag, Nb, Pd or Ta.

The light emitting device according to the embodiment may be provided in the second light emitting structure 20, and may include a fourth insulating layer 44 disposed at a peripheral portion of the second contact part 34. The fourth insulating layer 44 may electrically insulate the second contact part 34 from the second active layer 22. The fourth insulating layer 44 may electrically insulate the second contact part 34 from the second conductive fourth semiconductor layer 23.

For example, the fourth insulating layer 44 may be formed by using an oxide or a nitride. For example, the fourth insulating layer 44 may include at least one selected from the group consisting of SiO2, SixOy, Si3N4, SixNy, SiOxNy, Al2O3, TiO2, or AlN.

The light emitting device according to the embodiment may include a first pad 91 electrically connected to the first electrode 81. The first pad 91 may be exposed to a peripheral portion of the light emitting structure 10. The light emitting device according to the embodiment may include a second pad 92 electrically connected to the second electrode 82. The second pad 92 may be exposed to a peripheral portion of the first light emitting structure 10. The first pad 91 may be spaced apart from the second pad 92.

The first and second pads 91 and 92 may be disposed at a lower peripheral portion of the first light emitting structure 10. According to the embodiment, the first and second pads 91 and 92 may be disposed at one lateral side of the first light emitting structure 10. The first and second pads 91 and 92 may be disposed at the same lateral side of the first light emitting structure 10. Accordingly, an external power source may be easily connected to the first and second pads 91 and 92 in one direction of the first light emitting structure 10.

The first electrode 81 and the first pad 91 may be electrically connected to each other through a first connection wire 31. The second electrode 82 and the second pad 92 may be electrically connected to each other through a second connection wire 32. The second connection wire 32 may be disposed under the first electrode 81. The first electrode 81 may be disposed at a lower region of the first light emitting structure 10. The second electrode 82 may be disposed at a lower region of the second light emitting structure 20. The first connection wire 31 may be electrically insulated from the second connection wire 32 through the first insulating layer 41.

The first pad 91 and the second pad 92 may include at least one selected from the group consisting of Cu, Ni, Ti, Ti—W, Cr, W, Pt, V, Fe, or Mo. In addition, the first and second connection wires 31 and 32 may include at least one selected from the group consisting of Au, Cu, Ni, Ti, Ti—W, Cr, W, Pt, V, Fe, and Mo.

According to the embodiment, roughness may be disposed on a top surface of the first conductive first semiconductor layer 11. Roughness may be disposed on a top surface of the first conductive third semiconductor layer 21. Therefore, an amount of light extracted upward from the roughness region may be increased. A protrusion part 16 may be disposed on a top surface of the first conductive first semiconductor layer 11, and a second protrusion part 26 may be disposed on a top surface of the first conductive third semiconductor layer 21. The first protrusion part 16 may be disposed corresponding to the first contact part 33, and the second protrusion part 26 may be disposed corresponding to the second contact part 34.

Meanwhile, the light emitting device according to the embodiment may further include a protective layer 95 disposed at peripheral portions of the first and second light emitting structures 10 and 20. The protective layer 95 can protect the first and second light emitting structures 10 and 20. The protective layer 95 may insulate the first pad 91 from the first light emitting structure 10. The protective layer 95 may insulate the second pad 92 from the first light emitting structure 10.

For example, the protective layer 95 may be formed by using an oxide or a nitride. For example, the protective layer 95 may include at least one of SiO2, SixOy, Si3N4, SixNy, SiOxNy, Al2O3, TiO2, or AlN. Meanwhile, the protective layer 95 may be omitted according to designs.

According to the embodiment, the first light emitting structure 10 is driven by the first and third electrodes 81 and 83, and the second light emitting structure 20 may be driven by the second and third electrodes 82 and 83. Accordingly, the first and second light emitting structures 10 and 20 may be individually driven.

In other words, the light emitting device according to the embodiment may include a plurality of light emitting structures that can be individually driven in one device. Although the embodiment has been described in that two light emitting structures are arrayed in one light emitting device, at least three or four light emitting structures may be arranged in one light emitting device, and formed in such a manner that the light emitting structures may be individually driven.

If the light emitting structures are formed in the above manner, the light emitting structures, which are individually driven, can be arranged in smaller size as compared with the case that a plurality of light emitting devices are arranged in parallel and individually driven. In other words, when conventional several light emitting devices are connected to a package end, there is a limitation in narrowing the interval between the devices. However, according to the light emitting device of the embodiment, since a plurality of light emitting regions are separately disposed in one device, the interval between the light emitting regions can be significantly narrowed.

According to the embodiment, the first and second pads 91 and 92 may be disposed at one lateral side of the first light emitting structure 10, and an external power source may be connected with the first and second pads 91 and 92 in one direction. According to the embodiment, the first and second light emitting structures 10 and 20 may be individually driven. In addition, power is supplied with the same polarity to the first and second light emitting structures 10 and 20 through the third electrode 83 disposed at the lower region of the light emitting device, and supplied with different polarities to the first and second electrodes 81 and 82 through the first and second pads 91 and 92, respectively. The light emitting device having the above structure is provided for illustrative purpose, and may be usefully applied to a lighting apparatus of a vehicle, such as a headlight or a taillight of the vehicle.

Figure 4:
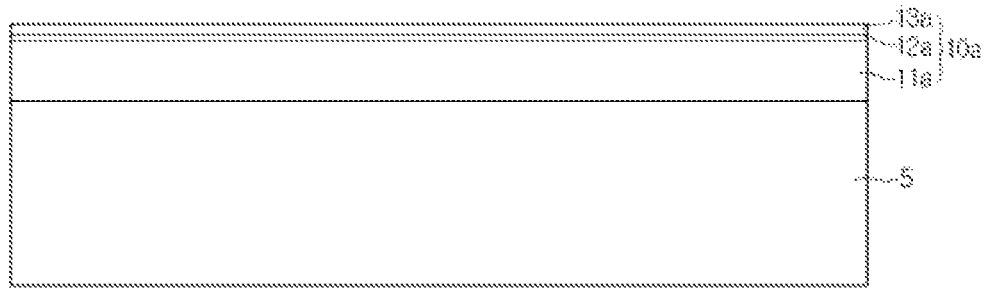
FIGS. 4 to 8 are sectional views showing a method of fabricating the light emitting device according to the embodiment.

According to the method of fabricating the light emitting device according to the embodiment, as shown in FIG. 4, a first conductive semiconductor layer 11$a$, an active layer 12$a$, and a second conductive semiconductor layer 13$a$ may be disposed on a substrate 5. The first conductive semiconductor layer 11$a$, the active layer 12$a$, and the second conductive semiconductor layer 13$a$ may define a light emitting structure 10$a$.

For example, the substrate 5 may include at least one of sapphire substrate (Al2O3), SiC, GaAs, GaN, ZnO, Si, GaP, InP, or Ge, but the embodiment is not limited thereto. A buffer layer may be additionally disposed between the first conductive semiconductor layer 11$a$ and the substrate 5.

For example, The first conductive semiconductor layer 11$a$ may include an N-type semiconductor layer doped with N-type dopants serving as first conductive dopants, and the second conductive semiconductor layer 13$a$ may include a P-type semiconductor layer doped with P-type dopants serving as second conductive dopants. In addition, the first conductive semiconductor layer 11$a$ may include a P-type semiconductor layer, and the second conductive semiconductor layer 13$a$ may include an N-type semiconductor layer.

For example, the first conductive semiconductor layer 11$a$ may include an N type semiconductor layer. The first conductive semiconductor layer 11$a$ may be formed by using a semiconductor material having a compositional formula of In$_x$Al$_y$Ga$_{1-x-y}$N ($0 \leq x \leq 1$, $0 \leq y \leq 1$, and $0 \leq x+y \leq 1$). For example, the first conductive semiconductor layer 11$a$ may include one selected from the group consisting of InAlGaN, GaN, AlGaN, AlInN, InGaN, AlN, and InN, and may be doped with N-type dopants such as Si, Ge, Sn, Se, and Te.

The active layer 12$a$ emits light due to the energy band gap difference according to materials constituting the active layer 12$a$ through the combination of electrons (or holes)

injected through the first conductive semiconductor layer 11a and holes (or electrons) injected through the second conductive semiconductor layer 13a. The active layer 12a may have one of a single quantum well (SQW) structure, a multi-quantum well (MQW) structure, a quantum dot structure, and a quantum wire structure, but the embodiment is not limited thereto.

The active layer 12a may be formed by using a semiconductor material having a compositional formula of $In_xAl_yGa_{1-x-y}N$ ($0 \leq x \leq 1$, $0 \leq y \leq 1$, and $0 \leq x+y \leq 1$). When the active layer 12a has an MQW structure, the active layer 12a may be formed by stacking a plurality of well layers and a plurality of barrier layers. For example, the active layer 12a may be formed at a cycle of InGaN well layer/GaN barrier layer.

For example, the second conductive semiconductor layer 13a may be formed by using a P type semiconductor layer. The second conductive semiconductor layer 13a may be formed by using a semiconductor material having a compositional formula of $In_xAl_yGa_{1-x-y}N$ ($0 \leq x \leq 1$, $0 \leq y \leq 1$, and $0 \leq x+y \leq 1$). For example, the second conductive semiconductor layer 13a may include one of InAlGaN, GaN, AlGaN, InGaN, AlInN, AlN, or InN and may be doped with P-type dopants such as Mg, Zn, Ca, Sr, or Ba.

Meanwhile, the first conductive semiconductor layer 11a may include a P-type semiconductor layer and the second conductive semiconductor layer 13a may include the N-type semiconductor layer. In addition, a semiconductor layer including an N-type or P-type semiconductor layer may be additionally disposed on the second conductive semiconductor layer 13a. Accordingly, the light emitting structure 10a may have at least one of an NP junction structure, a PN junction structure, an NPN junction structure, and a PNP junction structure. In addition, impurities may be doped into the first conductive semiconductor layer 11a and the second conductive semiconductor layer 13a with uniform or non-uniform doping concentration. In other words, the light emitting structure 10a may have various structures, and the embodiment is not limited thereto.

In addition, a first conductive InGaN/GaN superlattice structure or InGaN/InGaN superlattice structure may be disposed between the first conductive semiconductor layer 11a and the active layer 12a. In addition, a second conductive AlGaN layer may be disposed between the second conductive semiconductor layer 13a and the active layer 12a.

Figure 5:
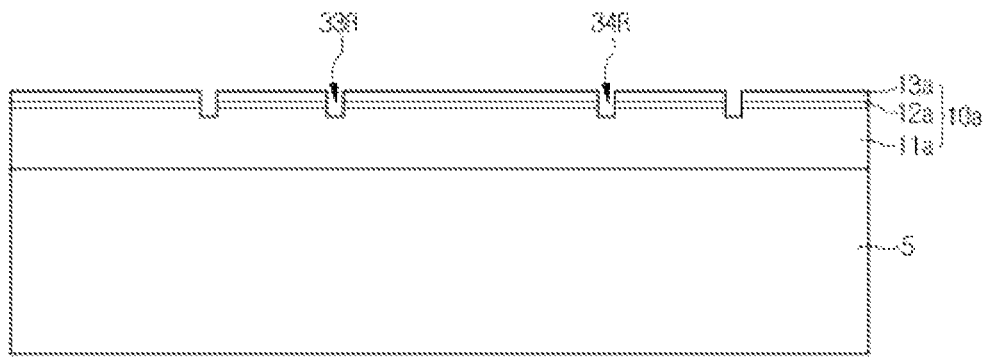

Next, as shown in FIG. 5, a plurality of recesses 33R and 34R may be disposed in the light emitting structure 10a. The recesses 33R and 34R may be disposed through the second conductive semiconductor layer 13a and the active layer 12a.

Figure 6:
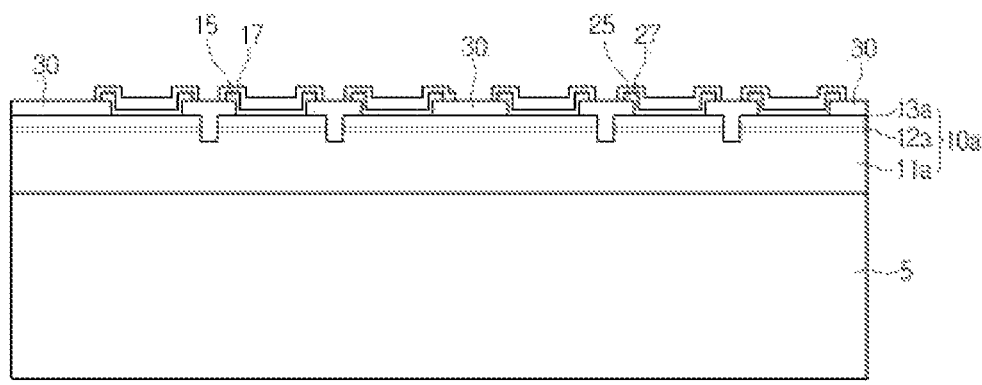

Subsequently, as shown in FIG. 6, the light emitting structure 10 may be disposed thereon with the channel layer 30, the third insulating layer 43, the fourth insulating layer 44, the first ohmic contact layer 15, the second ohmic contact layer 25, the first reflective layer 17, and the second reflective layer 27. The third and fourth insulating layers 43 and 44 may be disposed in the recesses 33R and 34R.

The channel layer 30 may be formed by using an insulating material. For example, the channel layer 30 may be formed by using an oxide or a nitride. For example, the channel layer 30 may include at least one of $SiO_2$, $Si_xO_y$, $Si_3N_4$, $Si_xN_y$, $SiO_xN_y$, $Al_2O_3$, $TiO_2$, or AlN.

The third and fourth insulating layers 43 and 44 may be formed by using an oxide or a nitride. For example, the third and fourth insulating layers 43 and 44 may include at least one of $SiO_2$, $Si_xO_y$, $Si_3N_4$, $Si_xN_y$, $SiO_xN_y$, $Al_2O_3$, $TiO_2$, or AlN. The third and fourth insulating layers 43 and 44 may include the same material as that of the channel layer 30 or a material different from that of the channel layer 30.

For example, the first and second ohmic contact layers 15 and 25 may include a transparent conductive oxide layer. For example, the first and second ohmic contact layers 15 and 25 may include at least one of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, or Ti.

The first and second reflective layers 17 and 27 may include a material having high reflectance. For example, the first and second reflective layers 17 and 27 may include metal including at least one i of Ag, Ni, Al, Rh, Pd, Ir, Ru, Mg, Zn, Pt, Cu, Au, or Hf, and the alloy thereof. In addition, the first and second reflective layers 17 and 27 may be disposed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the first and second reflective layers 17 and 27 may include at least one of Ag, Al, an Ag—Pd—Cu alloy, or an Ag—Cu alloy.

Figure 7:
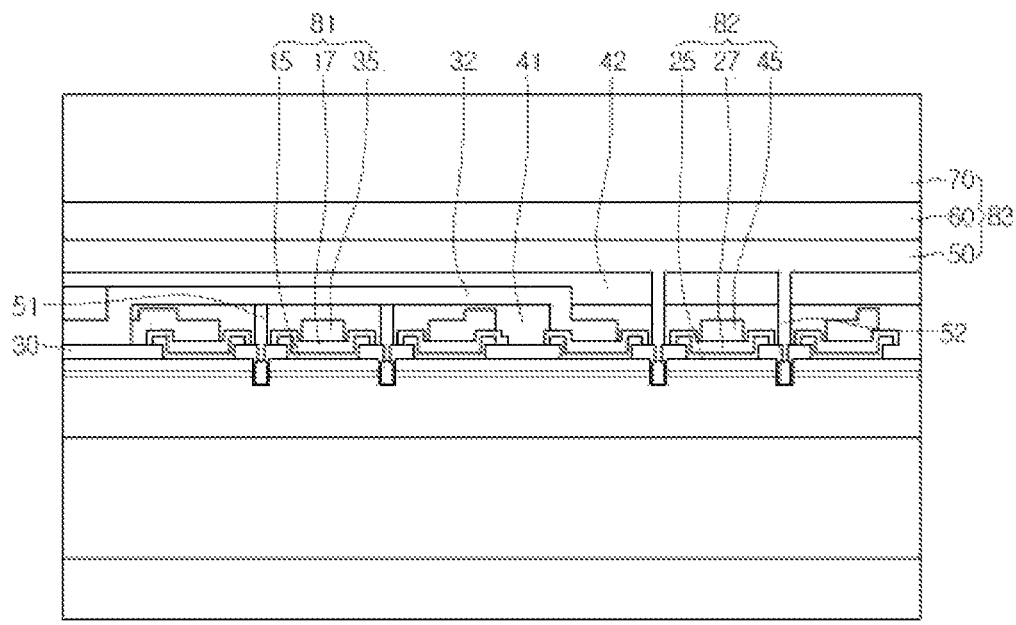

In addition, as shown in FIG. 7, recesses are disposed in the third and fourth insulating layers 43 and 44, and the first and second contact parts 33 and 34 may be disposed in the recesses. For example, the first and second contact parts 33 and 34 may include at least one of Cr, V, W, Ti, Zn, Ni, Cu, Al, Au, or Mo. The first and second contact parts 33 and 34 may make contact with the first conductive first semiconductor layer 11 and the first conductive third semiconductor layer 21.

Thereafter, as shown in FIG. 7, the first metal layer 35, the second metal layer 45, the first connection wire 31, the first insulating layer 41, the second connection wire 32, and the second insulating layer 42 may be disposed.

For example, the first and second metal layers 35 and 45 may include at least one of Au, Cu, Ni, Ti, Ti—W, Cr, W, Pt, V, Fe, or Mo. For example, the first and second connection wires 31 and 32 may include at least one of Au, Cu, Ni, Ti, Ti—W, Cr, W, Pt, V, Fe, or Mo. For example, the first and second insulating layers 41 and 42 may be formed by using an oxide or a nitride. For example, the first and second insulating layers 41 and 42 may include at least one of $SiO_2$, $Si_xO_y$, $Si_3N_4$, $Si_xN_y$, $SiO_xN_y$, $Al_2O_3$, $TiO_2$, or AlN.

Thereafter, as shown in FIG. 7, the third connection wire 51, the fourth connection wire 52, and the third metal layer 50 may be disposed. The third metal layer 50 may include at least one of Cu, Ni, Ti, Ti—W, Cr, W, Pt, V, Fe, or Mo. The third metal layer 50 may serve as a diffusion barrier layer. The third metal layer 50 may be disposed thereon with the bonding layer 60 and the conductive support member 70.

The third metal layer 50 may prevent a material included in the bonding layer 60 from being diffused to the reflective layer 17 and the second reflective layer 27 in the process of providing the bonding layer 60. The third metal layer 50 may prevent a material, such as Sn, included in the bonding layer 60 from exerting an influence on the reflective layer 17 and the second reflective layer 27.

The bonding layer 60 includes barrier metal or bonding metal. For example, the bonding layer 60 may include at least one of Ti, Au, Sn, Ni, Cr, Ga, In, Bi, Cu, Ag, Nb, Pd or Ta.

The conductive support member 70 may support the light emitting structure 10 according to the embodiment while performing a heat radiation function. The bonding layer 60 may be formed in the form of a seed layer.

For example, the conductive support member 70 may include at least one of semiconductor substrates (e.g., Si, Ge, GaN, GaAs, ZnO, SiC, or SiGe substrates) implanted with Ti, Cr, Ni, Al, Pt, Au, W, Cu, Mo, Cu—W, or impurities.

According to the embodiment, the third electrode 83 may include at least one of the third metal layer 50, the bonding layer 60, and the conductive support member 70. The third electrode 83 may include all of the third metal layer 50, the bonding layer 60, and the conductive support member 70. In addition, the third electrode 83 may selectively include one or two of the third metal layer 50, the bonding layer 60, and the conductive support member 70.

Then, the substrate 5 may be removed from the first conductive semiconductor layer 11a. As one example, the substrate 5 may be removed through a laser lift off (LLO) process. According to the LLO process, a laser is irradiated to the bottom surface of the substrate 5, so that the substrate 5 is delaminated from the first conductive semiconductor layer 11a.

Figure 8:
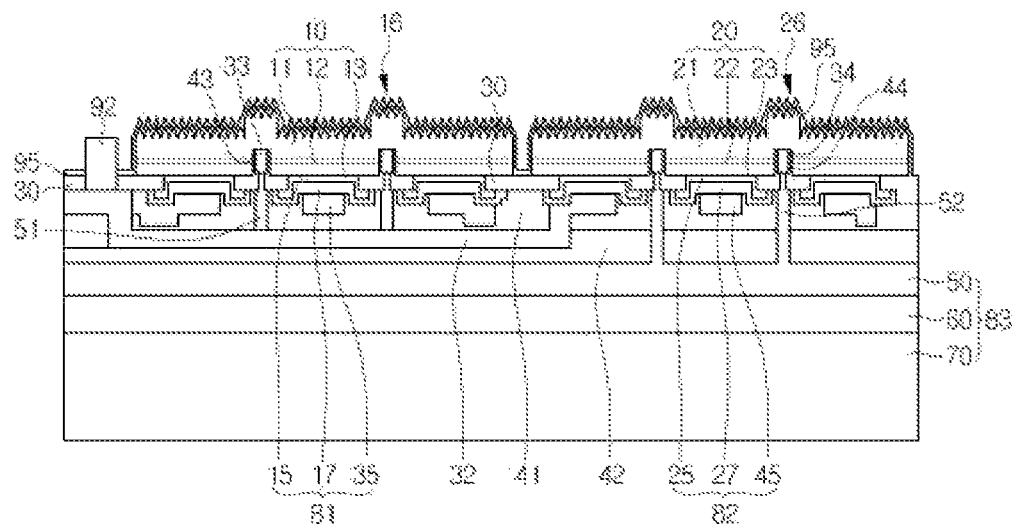

In addition, as shown in FIG. 8, the lateral side of the light emitting structure 10a may be etched and a portion of the channel layer 30 may be exposed through an isolation etching process. The isolation etching process may be performed in a dry etch scheme such as an inductively coupled plasma (ICP) scheme, but the embodiment is not limited thereto. The first and second light emitting structures 10 and 20 may be formed through the isolation etching process.

The first light emitting structure 10 may include the first conductive first semiconductor layer 11, the first active layer 12, and the second conductive second semiconductor layer 13. The second light emitting structure 20 may include the first conductive third semiconductor layer 21, the second active layer 22, and the second conductive fourth semiconductor layer 24.

According to the embodiment, roughness may be disposed on top surfaces of the first and second light emitting structures 10 and 20. In addition, the first protrusion part 16 may be disposed on a top surface of the first light emitting structure 10, and the second protrusion part 26 may be disposed on a top surface of the second light emitting structure 20. The light extraction patterns disposed in the first and second light emitting structures 10 and 20 are provided for illustrative purpose, and may be formed a photo electro chemical (PEC) etching process. Therefore, according to the embodiment, the light extraction effect can be increased.

In addition, as shown in FIGS. 8 and 3, the first and second pads 91 and 92 are disposed at one lateral side of the first light emitting structure 10. The first pad 91 may be electrically connected to the first electrode 81 through the connection wire 31, and the second pad 92 may be electrically connected to the second electrode 82 through the second connection wire 32.

Meanwhile, the light emitting device according to the embodiment may further include the protective layer 95 disposed at the peripheral portions of the first and second light emitting structures 10 and 20. The protective layer 95 may protect the first and second light emitting structures 10 and 20. The protective layer 95 may insulate the first pad 91 from the first light emitting structure 10. The protective layer 95 may insulate the second pad 92 from the first light emitting structure 10.

For example, the protective layer 95 may be formed by using an oxide or a nitride. For example, the protective layer 95 may include at least one selected from the group consisting of $SiO_2$, $Si_xO_y$, $Si_3N_4$, $Si_xN_y$, $SiO_xN_y$, $Al_2O_3$, $TiO_2$, or MN. Meanwhile, the protective layer 95 may be omitted according to designs.

The fabricating process described above is provided for illustrative purpose, and may be variously modified depending on designs or purposes.

According to the embodiment, the first light emitting structure 10 is driven by the first and third electrodes 81 and 83, and the second light emitting structure 20 may be driven by the second and third electrodes 82 and 83. Accordingly, the first and second light emitting structures 10 and 20 may be individually driven.

In other words, the light emitting device according to the embodiment may include a plurality of light emitting structures that can be individually driven in one device. Although the embodiment has been described in that two light emitting structures are arrayed in one light emitting device, at least three or four light emitting structures may be arranged in one light emitting device, and formed in such a manner that the light emitting structures may be individually driven.

If the light emitting structures are formed in the above manner, the light emitting structures, which are individually driven, can be arranged in smaller size as compared with the case that a plurality of light emitting devices are arranged in parallel and individually driven. In other words, when conventional several light emitting devices are connected to a package end, there is a limitation in narrowing the interval between the devices. However, according to the light emitting device of the embodiment, since a plurality of light emitting regions are separately disposed in one device, the interval between the light emitting regions can be significantly narrowed.

According to the embodiment, the first and second pads 91 and 92 may be disposed at one lateral side of the first light emitting structure 10, and an external power source may be connected with the first and second pads 91 and 92 in one direction. According to the embodiment, the first and second light emitting structures 10 and 20 may be individually driven. In addition, power is supplied with the same polarity to the first and second light emitting structures 10 and 20 through the third electrode 83 disposed at the lower region of the light emitting device, and supplied with different polarities to the first and second electrodes 81 and 82 through the first and second pads 91 and 92, respectively. The light emitting device having the above structure is provided for illustrative purpose, and may be usefully applied to a lighting apparatus of a vehicle, such as a headlight or a taillight of the vehicle.

Figure 9:
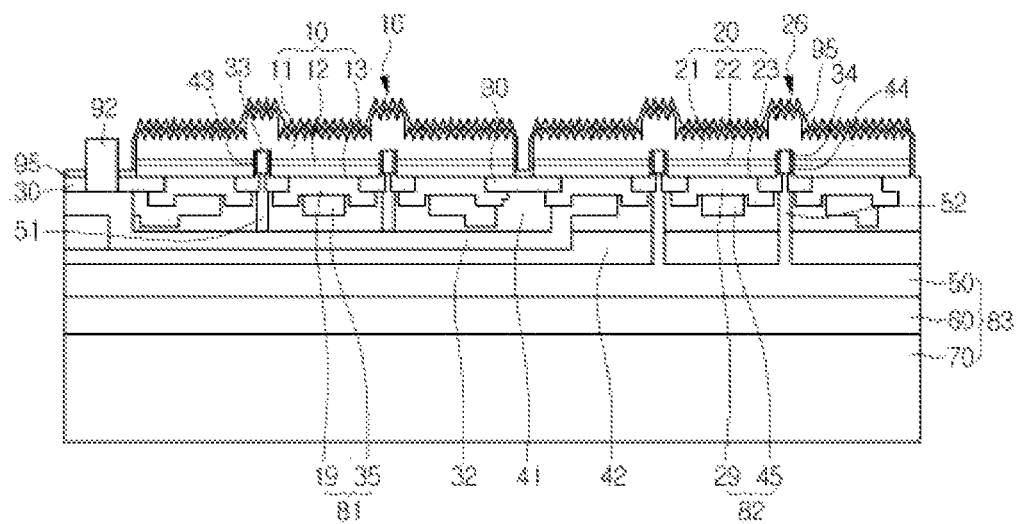
FIGS. 9 to 12 are sectional views showing another example of a light emitting device according to the embodiment.
Figure 10:
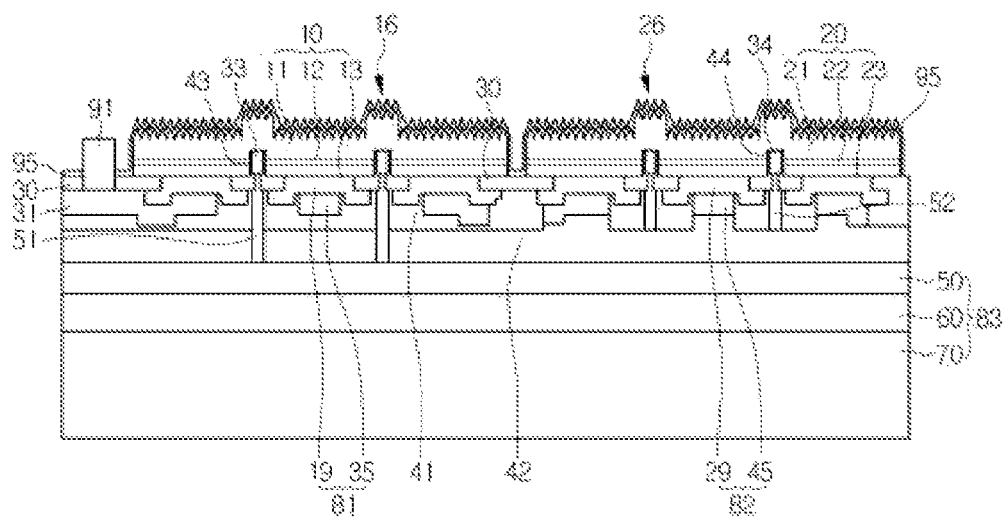

FIGS. 9 and 10 are sectional views showing another example of the light emitting device according to the embodiment. FIG. 9 is a sectional view taken along line A-A' of the light emitting device shown in FIG. 1, and FIG. 10 is a sectional view taken along line B-B' of the light emitting device shown in FIG. 1. In the following description referring to FIGS. 9 and 10, the structure and components the same as those described with reference to FIGS. 2 and 3 will not be further described.

According to the light emitting device of the embodiment, the first ohmic reflective layer 19 may be disposed under the first light emitting structure 10. The first ohmic reflective layer 19 may be formed with both functions of the first reflective layer 17 and the first ohmic contact layer 15. Therefore, the first ohmic reflective layer 19 may make ohmic contact with the second conductive second semiconductor layer 13 to reflect light incident from the first light emitting structure 10.

In this case, the first ohmic reflective layer 19 may be disposed in a multi-layer. For example, the first ohmic reflective layer 19 may be disposed by alternately providing an Ag layer and an Ni layer, and may include an Ni/Ag/Ni layer, a Ti layer, or a Pt layer.

According to the light emitting device of the embodiment, the conductive support member 70 disposed under the first ohmic reflective layer 19 may be electrically connected to the first conductive first semiconductor layer 11 disposed above the first ohmic reflective layer 19.

The first electrode 81 according to the embodiment may include at least one of the first ohmic reflective layer 19 and the first metal layer 35. According to the light emitting device of the embodiment, the conductive support member 70 disposed under the first electrode 81 may be electrically connected to the first conductive first semiconductor layer 11 disposed above the first electrode 81 through the first contact part 33 and the third connection wire 51.

According to the light emitting device of the embodiment, the second ohmic reflective layer 29 may be disposed under the second light emitting structure 20. The second ohmic reflective layer 29 may be formed with both functions of the second reflective layer 27 and the second ohmic contact layer 25. Therefore, the second ohmic reflective layer 29 may make ohmic contact with the second conductive fourth semiconductor layer 23 to reflect light incident from the second light emitting structure 20.

In this case, the second ohmic reflective layer 29 may be disposed in a multi-layer. For example, the second ohmic reflective layer 29 may be disposed by alternately providing an Ag layer and an Ni layer, and may include an Ni/Ag/Ni layer, a Ti layer, or a Pt layer.

The second electrode 82 according to the embodiment may include at least one of the second ohmic reflective layer 29 and the second metal layer 45. According to the light emitting device of the embodiment, the conductive support member 70 disposed under the second electrode 82 may be electrically connected to the first conductive third semiconductor layer 21 disposed above the second electrode 82 through the second contact part 34 and the fourth connection wire 52.

According to the embodiment, the first light emitting structure 10 is driven by the first and third electrodes 81 and 83, and the second light emitting structure 20 may be driven by the second and third electrodes 82 and 83. Accordingly, the first and second light emitting structures 10 and 20 may be individually driven.

In other words, the light emitting device according to the embodiment may include a plurality of light emitting structures that can be individually driven in one device. Although the embodiment has been described in that two light emitting structures are arrayed in one light emitting device, at least three or four light emitting structures may be arranged in one light emitting device, and formed in such a manner that the light emitting structures may be individually driven.

If the light emitting structures are formed in the above manner, the light emitting structures, which are individually driven, can be arranged in smaller size as compared with the case that a plurality of light emitting devices are arranged in parallel and individually driven. In other words, when conventional several light emitting devices are connected to a package end, there is a limitation in narrowing the interval between the devices. However, according to the light emitting device of the embodiment, since a plurality of light emitting regions are separately disposed in one device, the interval between the light emitting regions can be significantly narrowed.

According to the embodiment, the first and second pads 91 and 92 may be disposed at one lateral side of the first light emitting structure 10, and an external power source may be connected with the first and second pads 91 and 92 in one direction. According to the embodiment, the first and second light emitting structures 10 and 20 may be individually driven. In addition, power is supplied with the same polarity to the first and second light emitting structures 10 and 20 through the third electrode 83 disposed at the lower region of the light emitting device, and supplied with different polarities to the first and second electrodes 81 and 82 through the first and second pads 91 and 92, respectively. The light emitting device having the above structure is provided for illustrative purpose, and may be usefully applied to a lighting apparatus of a vehicle, such as a headlight or a taillight of the vehicle.

Figure 11:
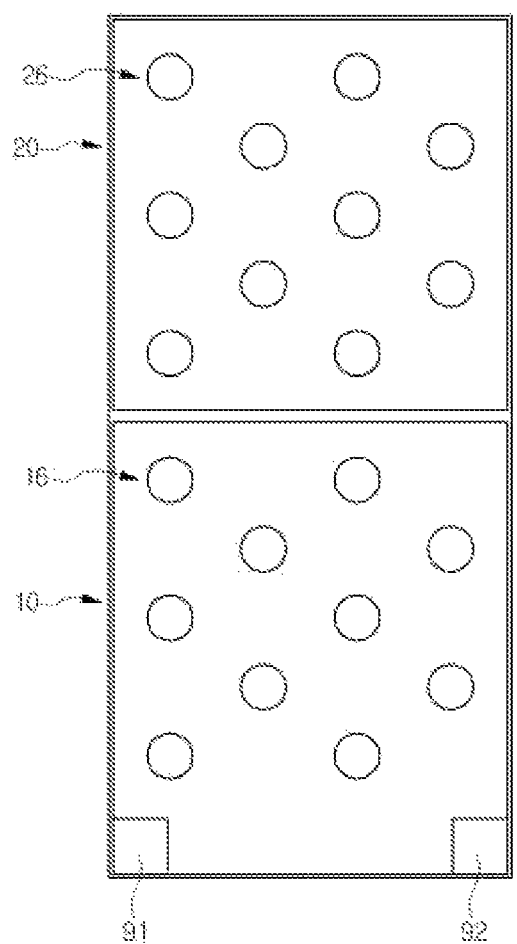
Figure 12:
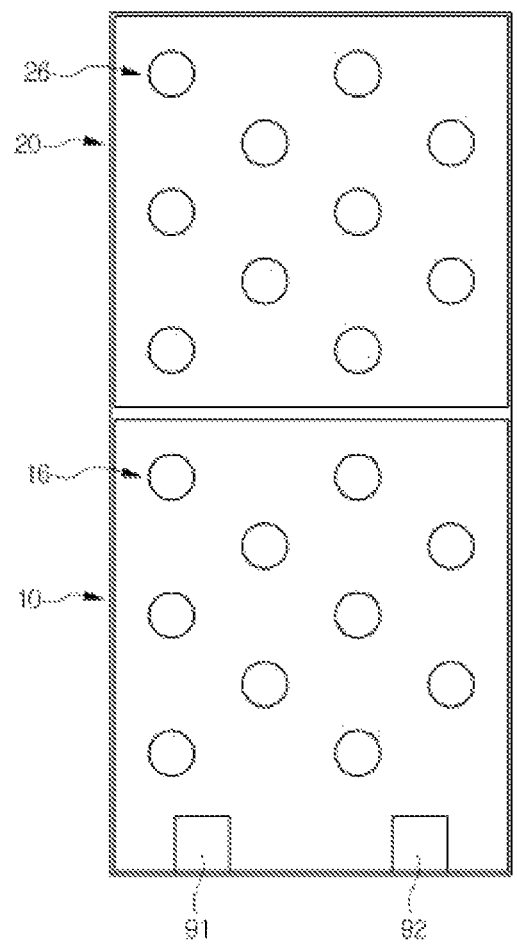

FIGS. 11 and 12 are views showing another example of the light emitting device according to the embodiment. The light emitting device shown in FIGS. 11 and 12 makes a difference the light emitting device shown in FIG. 1 in the arrangement positions of the first and second pads 91 and 92.

According to the embodiment, as shown in FIG. 11, the first pad 91 is disposed on one edge of a first lateral side of the first light emitting structure 10, and the second pad 92 may be disposed on another edge of the first lateral side of the first light emitting structure 10.

According to the embodiment, as shown in FIG. 12, the first and second pads 91 and 92 may be disposed on one lateral side of the first light emitting structure 10. Both of the first and second pads 91 and 92 may be disposed on a lateral side region instead of an edge region.

As described above, according to the light emitting device of the embodiment, the arrangement structure of the first pad 91 electrically connected with the first electrode 81, and the second pad 92 electrically connected to the second electrode 82 may be variously modified depending on purposes.

Figure 13:
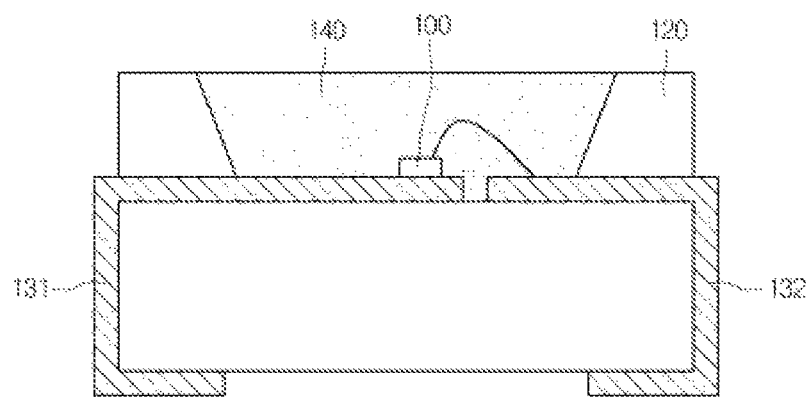
FIG. 13 is a sectional view showing a light emitting device package according to the embodiment.

FIG. 13 is a sectional view showing a light emitting device package to which the light emitting device according to the embodiment is applied.

Referring to FIG. 13, the light emitting device package according to the embodiment may include a body 120, first and second lead electrodes 131 and 132 disposed in the body 120, a light emitting device 100 disposed in the body 120 and electrically connected to the first and second lead electrodes 131 and 132 and a molding member 140 that surrounds the light emitting device 100.

The body 120 may include silicon, synthetic resin or metallic material, and an inclined surface may be disposed in the vicinity of the light emitting device 100.

The first and second lead electrodes 131 and 132 are electrically isolated from each other to supply power to the light emitting device 100. The first and second lead electrodes 131 and 132 can improve the light efficiency by reflecting the light emitted from the light emitting device 100. Further, the first and second lead electrodes 131 and 132 dissipate heat generated from the light emitting device 100 to the outside.

The light emitting device 100 can be disposed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may include phosphors to change the wavelength of the light emitted from the light emitting device 100.

A plurality of light emitting device or light emitting device packages according to the embodiment may be arrayed on a substrate, and an optical member including a lens, a light guide plate, a prism sheet, or a diffusion sheet may be disposed on the optical path of the light emitted from the light emitting device package. The light emitting device package, the substrate, and the optical member may serve as a light unit. The light unit is formed in a top view type or a side view type and variously provided in display devices of a portable terminal and a laptop computer or a lighting apparatus and an indicator apparatus.

In addition, a lighting apparatus according to another embodiment can include a light emitting device, or a light emitting device package according to the embodiment. For example, the lighting apparatus may include a lamp, a signal lamp, an electric sign board and a headlight of a vehicle. In addition, the lighting apparatus may be applied to a taillight of a vehicle as well as the headlight of the vehicle.

The light emitting device according to the embodiment may be applied to the light unit. The light unit has a structure in which a plurality of light emitting devices are arrayed. The light unit may include a display device and the lighting apparatus.

Figure 14:
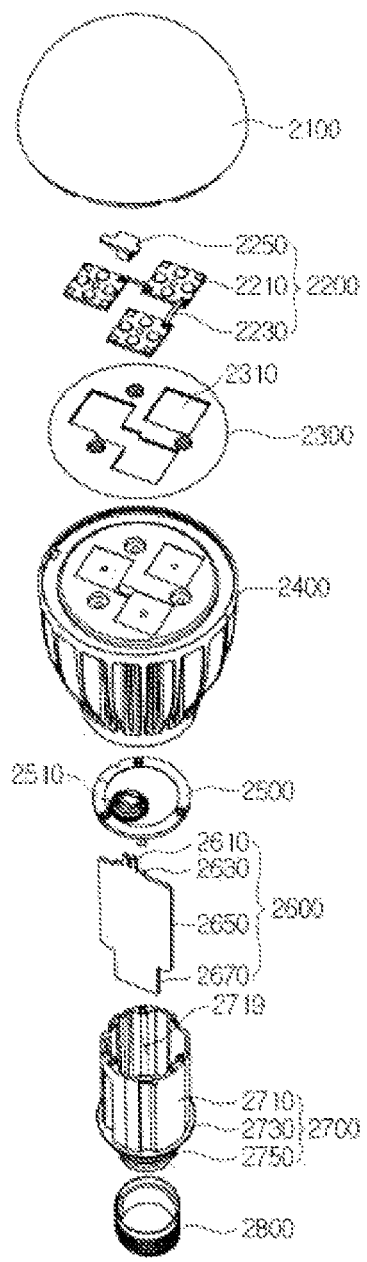
FIG. 14 is an exploded view showing a light unit according to the embodiment.

FIG. 14 is an exploded perspective view showing a lighting apparatus according to the embodiment.

Referring to FIG. 14, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be a kind of an optical member. The cover 2100 may be coupled with the radiator 2400. The cover 2100 may include a coupling part which is coupled with the radiator 2400.

The cover 2100 may include an inner surface coated with a milk-white pigment. The milk-white pigment may include a diffusion material to diffuse light. The surface roughness of the inner surface of the cover 2100 may be greater than the roughness of the outer surface of the cover 2100. The surface roughness is provided for the purpose of sufficiently scattering and diffusing the light from the light source module 2200 to discharge the light to the outside.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be disposed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500. The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

The embodiment provides a light emitting device having improved light extraction efficiency and including a plurality of light emitting structures, which are individually driven, a light emitting device package, and a light unit.

According to the embodiment, there is provided a light emitting device. The light emitting device may include first and second light emitting structures. The light emitting structure may include a first conductive first semiconductor layer, a first active layer under the first conductive first semiconductor layer, and a second conductive second semiconductor under the first active layer. The second light emitting structure may include a first conductive third semiconductor layer, a second active layer under the first conductive third semiconductor layer, and a second conductive fourth semiconductor layer under the second active layer.

According to the embodiment, the light emitting device may include a first electrode electrically connected to the first light emitting structure, a first electrode disposed under the first light emitting structure and electrically connected the first light emitting structure, a second light emitting structure, a second electrode disposed under the second light emitting structure and electrically connected to the second light emitting structure, a third electrode disposed under the first light emitting structure and electrically connected to the first light emitting structure and the second light emitting structure.

According to the embodiment, there is provided a light emitting device package. The light emitting device package may include a body, the light emitting device disposed on the body, and first and second lead electrodes electrically connected to the light emitting device.

According to the embodiment, there is provided a light unit including a substrate, the light emitting device disposed on the substrate, and an optical member to which light generated from the light emitting device passes.

As described above, the light emitting device, the light emitting device package, and the light unit according to the embodiment can improve light extraction efficiency and individually drive a plurality of light emitting structures.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a first light emitting structure including a first conductive type first semiconductor layer, a second conductive type second semiconductor layer under the first conductive type first semiconductor layer, and a first active layer provided between the first conductive type first semiconductor layer and the second conductive type second semiconductor layer;
a second light emitting structure including a first conductive type third semiconductor layer, a second conductive type fourth semiconductor layer under the first conductive type third semiconductor layer and a second active layer provided between the first conductive type third semiconductor layer and the second conductive type fourth semiconductor layer;
a first electrode electrically connected to the second conductive type second semiconductor layer;
a second electrode electrically connected to the second conductive type fourth semiconductor layer;
a third electrode electrically connected to the first conductive type first semiconductor layer and the first conductive type third semiconductor layer; wherein the third electrode includes a conductive support member;
a first contact part at a lower region of the first conductive type first semiconductor layer and electrically connected to the first conductive type first semiconductor layer and the third electrode;
a second contact part at a lower region of the first conductive type third semiconductor layer and electrically connected to the first conductive type third semiconductor layer and the third electrode;
a first pad electrically connected to the first electrode;
a second pad electrically connected to the second electrode;
a connection wire provided between the first light emitting structure and the conductive support member;
a first recess provided in the lower region of the first conductive type first semiconductor layer passing through the second conductive type second semiconductor layer and the first active layer;
a second recess provided in the lower region of the first conductive type third semiconductor layer passing through the second conductive type fourth semiconductor layer and the second active layer;
a first insulating layer provided between the first light emitting structure and a first region of the conductive support member and between the second light emitting structure and a second region of the conductive support member;
a second insulating layer provided between the first insulating layer and the conductive support member; and
a third insulating layer provided at a peripheral portion of a bottom surface of the first light emitting structure and a peripheral portion of a bottom surface of the second light emitting structure,
wherein the connection wire is connected to the second pad and the second electrode,
wherein the connection wire vertically overlaps the first light emitting structure and the second light emitting structure,
wherein the connection wire is provided between the first insulating layer and the second insulating layer, and
wherein an area of a top surface of the first electrode overlapped vertically with the first light emitting struc- ture is smaller than an area of a top surface of the second electrode overlapped vertically with the second light emitting structure.

2. The light emitting device of claim 1, wherein the first light emitting structure is driven by the first electrode and the third electrode and the second light emitting structure is driven by the second electrode and the third electrode such that the first light emitting structure and the second light emitting structure are individually driven,
   wherein an interval between the first pad and the second pad is smaller than an interval between the first pad and the second light emitting structure, and
   wherein the first light emitting structure is provided between the first pad and the light emitting structure.

3. The light emitting device of claim 1, wherein the first pad is exposed to a first concave portion of the first light emitting structure, and the second pad is exposed to a second concave portion of the first light emitting structure,
   wherein the first concave portion and the second concave portion are concaved in a direction toward the second light emitting structure from a first lateral side of the first light emitting structure.

4. The light emitting device of claim 1, wherein the first electrode includes a first ohmic contact layer, a first, reflective layer under the first ohmic contact layer, and a first metal layer under the first reflective layer that are provided under the first light emitting structure, and the second electrode includes a second ohmic contact layer, a second reflective layer under the second ohmic contact layer, and a second metal layer under the second reflective layer that are provided under the second light emitting structure.

5. The light emitting device of claim 1, wherein the first insulating layer electrically insulates the first electrode from the second electrode,
   wherein the first insulating layer electrically insulates the first electrode from the connection wire, and
   wherein the first insulating layer electrically insulates the connection wire from the conductive support member.

6. The light emitting device of claim 1, wherein the second insulating layer is provided between the first electrode and the third electrode and between the second electrode, and the third electrode,
   wherein an outer portion of the connection wire is provided between the first insulating layer and the third insulating layer, and
   wherein a portion of the third insulating layer vertically overlaps and intermediate region between the first and second light emitting structures and vertically overlaps the connection wire.

7. The light emitting device of claim 1, wherein the first contact part is electrically connected to the conductive support member of the third electrode,
   wherein the second contact part is electrically connected to the conductive support member of the third electrode,
   wherein the first contact part is provided through the first active layer and the second contact part is provided through the second active layer, and
   wherein the third insulating layer is provided in the first recess and the second recess.

8. The light emitting device of claim 7, further comprising a wire connection to electrically connect the first contact part to the third electrode and to electrically connect the second contact part to the third electrode.

9. The light emitting device of claim 1, further comprising:
   a first connection wire to electrically connect the first electrode to the first pad,
   wherein a outer portion of the first connection wire vertically overlaps the first pad, and
   wherein an outer portion of the connection wire vertically overlaps the second pad.

10. The light emitting device of claim 1, wherein the first pad and the second pad are provided at a first lateral side of the first light emitting structure, and
    wherein a portion of the first light emitting structure is provided between the first pad and the second pad.

11. The light emitting device of claim 1, wherein the first pad and the second pad are provided at one lateral side of the first light emitting structure, and
    wherein the first pad is provided between a first region and a second region of the one lateral side of the light emitting structure.

12. The light emitting device of claim 1, wherein the first pad is provided at one edge of a first lateral side of the first light emitting structure, and the second pad is provided at another edge of the first lateral side of the first light emitting structure,
    wherein a portion of the light emitting structure is provided between the first and the second pad.

13. A light emitting device package comprising:
    a body;
    a light emitting device disposed on the body and claimed according to claim 1; and
    first and second lead electrodes electrically connected to the light emitting device.

14. The light emitting device of claim 1, wherein the first conductive type first semiconductor layer includes a plurality of first protrusion parts on a top surface thereof, wherein the first conductive type third semiconductor layer includes a plurality of second protrusion parts on a top surface thereof, wherein a material of the plurality of first protrusion parts is the same as the first conductive type first semiconductor layer, wherein a material the plurality of second protrusion parts is the same as the first conductive type third semiconductor layer, wherein the plurality of first protrusion parts and the plurality of second, protrusion parts include a roughness on top surfaces thereof, wherein each of the plurality of first protrusions is vertically overlapped with the first contact part, and wherein each of the plurality of second protrusions is vertically overlapped with the second contact part.

15. The light emitting device of claim 1, wherein a first to surface of the first conductive type first semiconductor layer and a top surface of the first conductive type third semiconductor layer comprise a first roughness,
    wherein the first conductive type first semiconductor layer includes a plurality of first protrusion parts on the top surface thereof,
    wherein the first conductive type third semiconductor layer includes a plurality of second protrusion parts on the top surface thereof,
    wherein the plurality of first protrusion parts and the plurality of second protrusion parts include a second roughness,
    wherein a thickness of the plurality of first protrusion parts is equal to or larger than a thickness of the first conductive type first semiconductor layer, and
    wherein a thickness of the plurality of second protrusion parts is equal to or larger than a thickness of the first conductive type third semiconductor layer.

16. The light emitting device of claim 1, wherein the first light emitting structure includes a first concave portion and a second concave portion spaced apart from the first concave portion,
  wherein the first concave portion and the second concave portion' are concaved in a direction toward the second light emitting stricture from a first lateral side of the first light emitting structure,
  wherein the first pad is provided in the first concave portion of the first light emitting structure,
  wherein the second pad is provided in the second concave portion of the first light emitting structure, and
  wherein a portion of the first light emitting structure is provided between the first pad and the second pad.

17. A light emitting device comprising:
  a first light emitting structure, wherein the first light emitting structure includes a first conductive type first semiconductor layer, a first active layer under the first conductive type first semiconductor layer, and a second conductive type second semiconductor layer under the first active layer;
  a first electrode provided under the first light emitting structure and electrically connected to the second conductive type second semiconductor layer;
  a second light emitting structure, wherein the second light emitting structure includes a first conductive type third semiconductor layer, a second active layer under the first conductive type third semiconductor layer, and a second conductive type fourth semiconductor layer under the second active layer;
  a second electrode disposed under the second light emitting structure and electrically connected to the second conductive type fourth semiconductor layer;
  a third electrode disposed under the first light emitting structure and the second light emitting structure and electrically connected to the first conductive type first semiconductor layer and the first conductive type third semiconductor layer;
  a first pad electrically connected to the first electrode;
  a second pad electrically connected to the second electrode,
  a first contact part at a lower region of the first conductive type first semiconductor layer,
  a second contact part at lower region of the first conductive type third semiconductor layer;
  an insulating layer between the first electrode and the third electrode and between the second electrode and third electrode; and
  a connection wire provided in the insulating layer between the first electrode and the third electrode and electrically connected between the second pad and the second electrode,
  wherein the first light emitting structure includes a first concave portion and a second concave portion spaced apart from the first concave portion,
  wherein the first concave portion and the second concave portion are concaved in a direction toward the second light emitting structure from a first lateral side of the first light emitting structure,
  wherein the first pad is provided in the first concave portion of the first light emitting structure,
  wherein a portion of the first light emitting structure is provided between the first pad and the second pad.

18. The light emitting device of claim 17, further comprising a protective layer provided on a surface of the first light emitting structure and a peripheral portion of the second light emitting structure,
  wherein a portion of the insulating layer vertically overlaps an intermediate region between the first and the second light emitting structures and vertically overlaps the connection wire, and
  wherein the protective layer contacts the portion of the insulating layer.

19. The light emitting device of claim 17, wherein the third electrode includes a conductive support member,
  wherein the conductive support member is provided under the insulating layer and vertically overlaps the first light emitting structure and the second light emitting structure,
  wherein the first pad and the second pad are overlapped with the conductive support member in a vertical direction,
  wherein the connection wire includes a first connection portion overlapped vertically with the second concave portion, a second connection portion overlapped vertically with the second electrode, and a third connection portion between the first connection portion and the second connection portion, and
  wherein the third connection portion of the connection wire is vertically overlapped with the first light emitting structure.

20. The light emitting device of claim 19, wherein the first connection portion of the connection wire is connected to the second pad,
  wherein the second connection portion of the connection wire is connection, to the second electrode,
  wherein the third connection portion of the connection wire is located at a lower position then a position of the first connection portion and the second connection portion.

* * * * *